(12) United States Patent
Lin et al.

(10) Patent No.: US 6,942,764 B1
(45) Date of Patent: Sep. 13, 2005

(54) ARC-SPRAYED SHIELD FOR PRE-SPUTTER ETCHING CHAMBER

(75) Inventors: Cheng-Kun Lin, Hsinchu (TW); Chin-Shien Yang, Hsin-chu (TW); Chuan-Huai Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 08/518,705

(22) Filed: Aug. 24, 1995

(51) Int. Cl.[7] ............................................. C23C 14/34
(52) U.S. Cl. .......................... 204/192.32; 204/298.31; 427/456
(58) Field of Search ....................... 204/192.1, 192.32, 204/298.01, 298.11, 298.31, 192.38; 427/446, 427/448, 455, 456; 156/345, 67, 71, 345.3, 156/345.43; 216/67, 71

(56) References Cited

U.S. PATENT DOCUMENTS

| | | | |
|---|---|---|---|
| 3,661,761 A | 5/1972 | Koenig | 204/298 |
| 4,298,443 A * | 11/1981 | Maydan | 204/192.32 |
| 4,320,251 A | 3/1982 | Narasimhan et al. | 136/256 |
| 4,414,069 A * | 11/1983 | Cuomo | 204/192.32 |
| 4,419,201 A * | 12/1983 | Levinstein et al. | 204/192.32 |
| 5,135,629 A * | 8/1992 | Sawada et al. | 204/192.12 |
| 5,482,612 A * | 1/1996 | Armstrong et al. | 204/298.11 |

FOREIGN PATENT DOCUMENTS

JP   05-247634   * 9/1993 ............ 204/298.11

OTHER PUBLICATIONS

Maissel et al, in the IBM Journal of Research and Development vol 14 p 176, Mar. 1970.

* cited by examiner

Primary Examiner—Rodney G. McDonald

(57) ABSTRACT

Contamination due to deposited particulate matter has been greatly reduced in single wafer sputter-etchers by coating the full interior of the sputtering shield with a layer of an arc-sprayed material such as aluminum, said layer being possessed of a high degree of surface roughness. The method for forming the coating of arc-sprayed aluminum is described and data comparing particulate contaminant count and product yield before and after the adoption of the present invention, are presented.

8 Claims, 4 Drawing Sheets

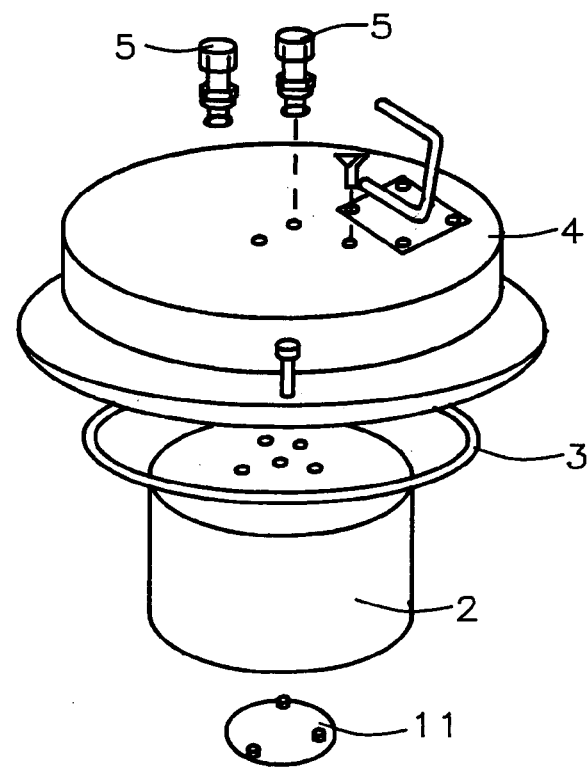
FIG. 1 – Prior Art
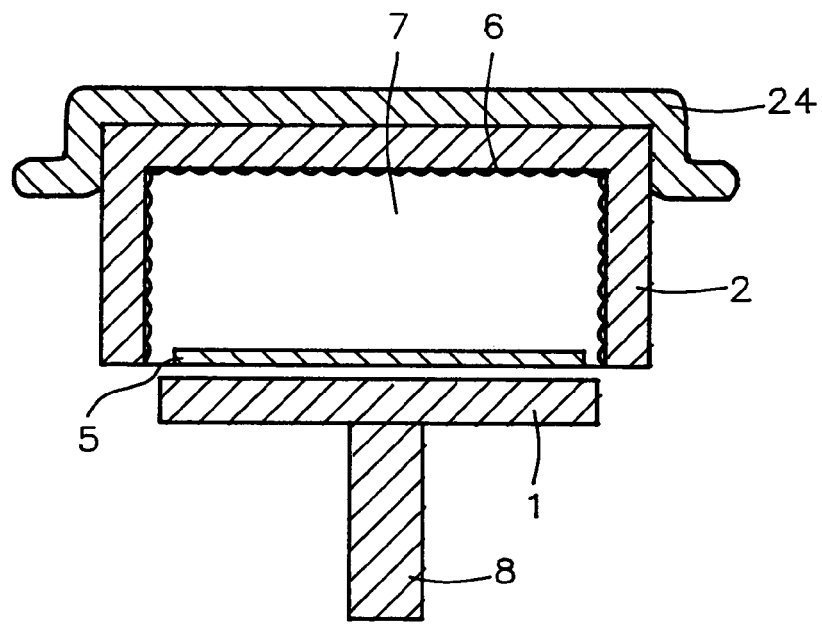
FIG. 2

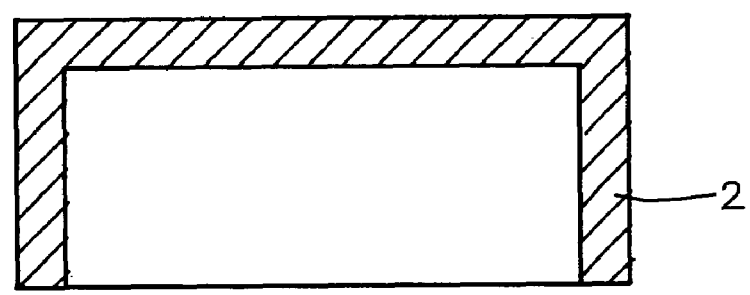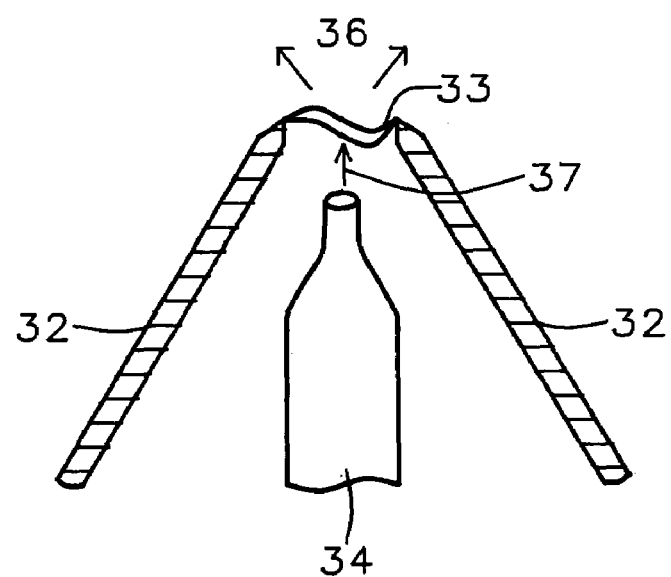
FIG. 3

US 6,942,764 B1

ARC-SPRAYED SHIELD FOR PRE-SPUTTER ETCHING CHAMBER

BACKGROUND OF THE INVENTION (1) Field of the Invention

The invention relates to the general field of etching by non chemical means, particularly RF sputter-etching.

(2) Description of the Prior Art

RF (radio frequency) sputter-etching is a universal etching technique, although the actual rate at which material gets removed does vary from one material to another. DC (direct current) sputter-etching is similar, but is limited to electrically conductive material, which RF sputter-etching is not. The basic setup is to provide two electrodes—a substrate holder and a sputtering shield, immerse them in gas at low pressure and apply an RF voltage between them.

FIG. 1 shows an exploded isometric view of part of a standard sputter-etcher of this type, in this case Electrotech's model MS6210 which was used in the development and reduction to practice of the present invention. During use, silicone oil cooled substrate holder 1 (shown in FIG. 2) is positioned just inside the open lower portion of sputtering shield 2. Air cooled lid 4 is attached to 2 along with vacuum tight O-ring seal 3. The various attachments labelled as 5 include means for admitting the sputtering gas through lid 4 and controlling its pressure, as well as means for applying the RF power. Gas baffle 11 is also shown.

Not shown in FIG. 1 is a vacuum chamber within which the sputter etcher resides during use. An appropriate sputtering gas (usually argon) is admitted into said vacuum chamber during use, its admission rate being adjusted so that some particular desired pressure level can be maintained. Said pressure is commonly about $6 \times 10^{-3}$ torr. RF voltage is applied between the substrate holder and the sputtering shield, initiating an RF glow discharge, and material is removed for both electrodes at a rate that is inversely proportional to some power (between 1 and 2, depending on the exact geometry) of the ratio of their two areas. See, for example, Koenig in U.S. Pat. No. 3,661,761 May 9, 1972. Since the area of the substrate holder is, by design, significantly less than that of the sputtering shield, the rate at which material will be removed from the substrate (assumed to be covering almost the entire substrate holder surface) will be substantially greater than the rate of material removal from the sputtering shield.

Sputter-etchers of the type illustrated in FIG. 1 are intended for the sputter-etching of a single semiconductor wafer at a time. This allows for better control of the amount of material removed from different wafers than is possible in a batch system which processes many wafers at a time. However, in order to make the throughput of such a system economically attractive in a manufacturing environment, it is necessary that the time taken to etch a given wafer be kept as low as possible. This implies that significantly higher etch rates, and therefore significantly higher levels of RF power density, must be used relative to the batch methods. To avoid the need for very high RF voltages to achieve these high power densities (typically about 300 watts per wafer) these single wafer etchers operate at higher gas pressures (where plasma resistance is lower) than do the batch units.

This use of high pressure, and particularly high power, is known to have certain undesirable side effects, notably the generation of fine dust particles, some of which find their way onto the surface that was sputter-etched. Any particulate matter of this type, if allowed to settle on the surface of an integrated circuit during the course of its manufacture, has a high probabilty of destroying said circuit, thus reducing the overall product yield.

The solution to this problem, which forms the subject matter of the present invention, involves the coating of the inside wall of the sputtering shield with a layer of material that has a rough surface, such as that obtained when said layer has been deposited through the method of arc-spraying. The use of arc-sprayed material in connection with integrated circuits has been described by Narasimhan et al. in U.S. Pat. No. 4,320,251 Mar. 16, 1982. Said invention relates to the formation of ohmic contacts in solar cells (using arc-sparaying) and does not relate in any way to sputter-etching.

The exact reasons for the efficacy of the present invention are not fully understood and it is likely that more than one physical mechanism is involved. One of these possible mechanisms is that the rough surface associated with layers deposited through arc-spraying is better able to trap material originating at the substrate and prevent its re-emission and eventual return to the substrate. The ability of small receivers of a particular geometrical shape to suppress re-emission during sputter deposition was described by Maissel et al. in the IBM Jour. of R&D vol. 14 p. 176 in March 1970. However, this is only a very general teaching and does not suggest the detailed present invention, even assuming that the suppression of re-emission is the only physical mechanism involved.

SUMMARY OF THE INVENTION

It is an object of the present invention to provide a sputter-etcher that generates a low level of particulate contamination during use.

It is a further object of the present invention to provide a sputter-etcher wherein the useful life of the sputtering shield is substantially extended relative to that of the prior art.

Yet another object of the present invention is to provide a sputter-etcher which, if allowed to lie idle for an extended period of time, does not, on the resumption of its use, generate a higher than normal level of particulate contamination.

Still a further object of the present invention is to provide a method for the manufacture and use of such a sputter-etcher.

These objects have been achieved by coating the full interior of the sputtering shield with a layer of an arc-sprayed material such as aluminum, said layer being possessed of a high degree of roughness.

BRIEF DESCRIPTION OF THE DRAWINGS

FIG. 1 shows part of a commercially available sputter-etcher.

FIG. 2 shows the modification to the etcher of FIG. 1 that forms the basis of the present invention.

FIG. 3 shows how an arc-sprayed coating of aluminum may be formed on the inside of a sputtering shield.

DESCRIPTION OF THE PREFERRED EMBODIMENTS

Figure 4:
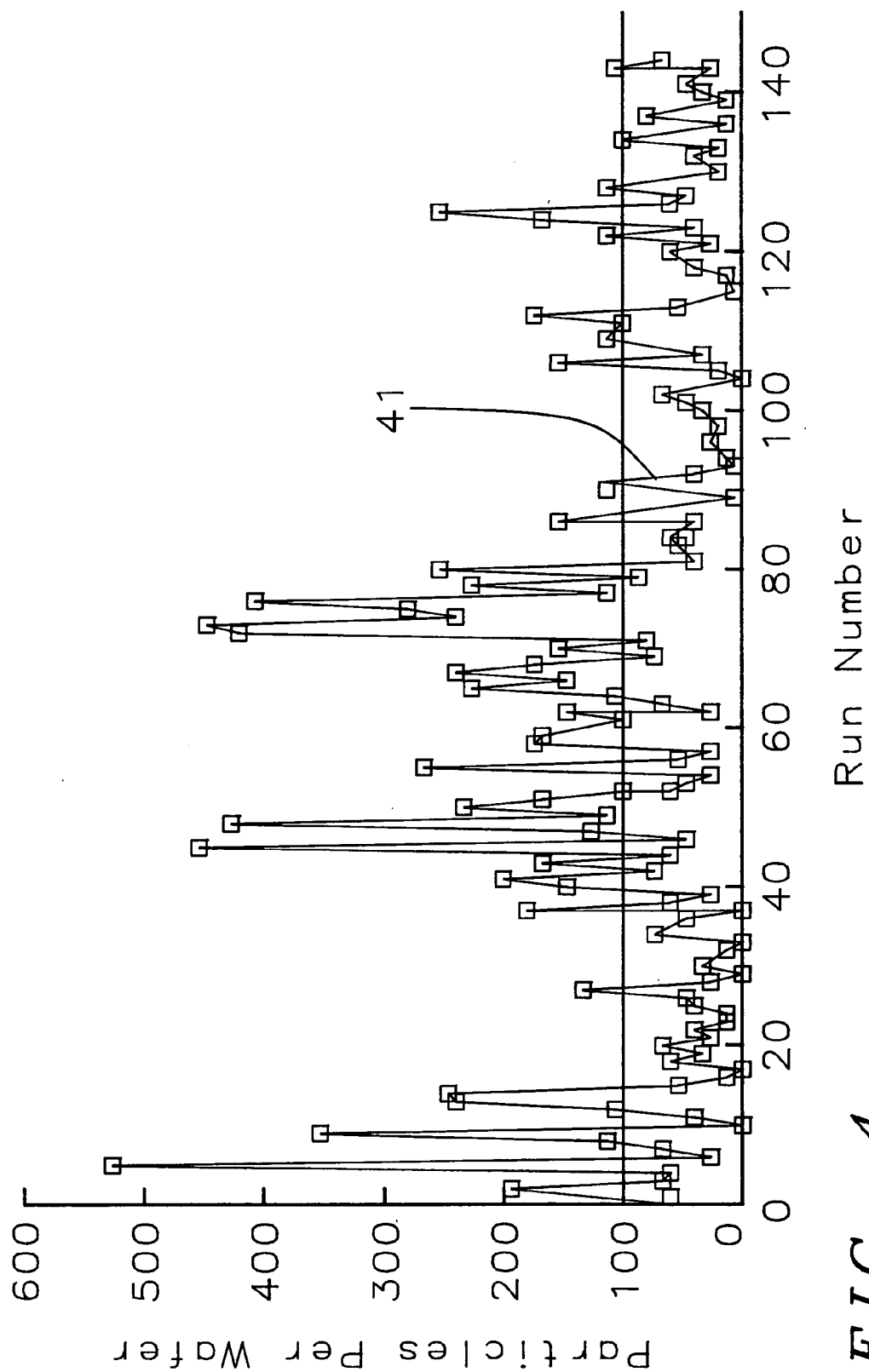
FIG. 4 shows the number of contaminating particles observed per wafer before and after the sputter-etcher was modified in accordance with the present invention.

Referring now to FIG. 2, we show in schematic cross-section, the key parts (relative to the present invention) of the sputter-etcher shown in FIG. 1. A substrate holder 8, supporting substrate 5, is positioned just inside sputtering shield 2. Lid 24 (simplified here so the gas admission control and the gas baffle are not shown) sits on top of shield 2. When an RF glow discharge is initiated in region 7 (by applying an RF voltage between about 1,550 and 1,750 volts), material from the surface of 5 is removed at a steady rate which is typically about 200 Angstrom units per minute. However, the present invention, as we will describe it below, is applicable to a wide range of deposition rates—from about 100 to about 250 Angstrom units per minute.

A key feature of the present invention is layer 6 which covers the entire inside surface of sputtering shield 2. The inside surface of layer 6, whose thickness may be anything from about 120 microns to about 180 microns (a value of 150 microns being typical), has a high degree of roughness. Typically the roughness value of layer 6 is about 150 microns on the A.A. scale, but the roughness could be anything from about 120 to about 200 microns on the A.A. scale without reducing the effectiveness of the present invention.

Our preferred material and deposition technique for layer 6 has been arc-sprayed aluminum, although other metals and/or deposition techniques could be used. The method and equipment that we have used for the deposition of layer 6 is schematically illustrated in FIG. 3. Aluminum rods 32 are positioned directly below sputtering shield 2, facing its open end. Said rods are connected to a high current/low voltage power supply. They are briefly brought into contact at their tips and then separated again a short distance, causing arc 33 to strike between the tips. At the same time, an inert gas, such as nitrogen, is directed from gas source 34 in a diverging stream 37 through arc 33.

When gas stream 37 emerges on the far side of arc 33 (as stream 36) it carries with it molten droplets of aluminum that originated within the arc or at the tips of rods 32. Said droplets land on the inside surface of sputtering shield 2 where they immediately freeze, gradually forming layer 6 (as shown in FIG. 2). The direction of gas stream 37 may be varied by movement of source 34 so as to ensure complete and reasonably uniform coverage of the inside of shield 2.

We have observed a distinct reduction in the amount of particulate matter contaminating our product since we started using sputtering shields built in accordance with the teachings of the present invention. For example, in FIG. 4 we show the number of contaminant particles per wafer observed for a series of sputter-etch runs. Runs 1 through 87 were performed using the old-style equipment wherein the sputtering shields lacked the arc-sprayed linings. Starting with run 88 (pointed to by arrow 41) the new-style equipment was used.

A sputter-etch run was deemed to be successful if the level of particulate contamination was less than 100 particles per wafer. As can be seen, once the new-style equipment was being used, the vast majority of the sputter-etch runs were successful and the worst case level of particulate contamination was about 280 particles per wafer. This was in contrast with the old-style equipment where about half the sputter-etch runs were unsuccessful and the worst case level of particulate contamination was about 630 particles per wafer.

Figure 5:
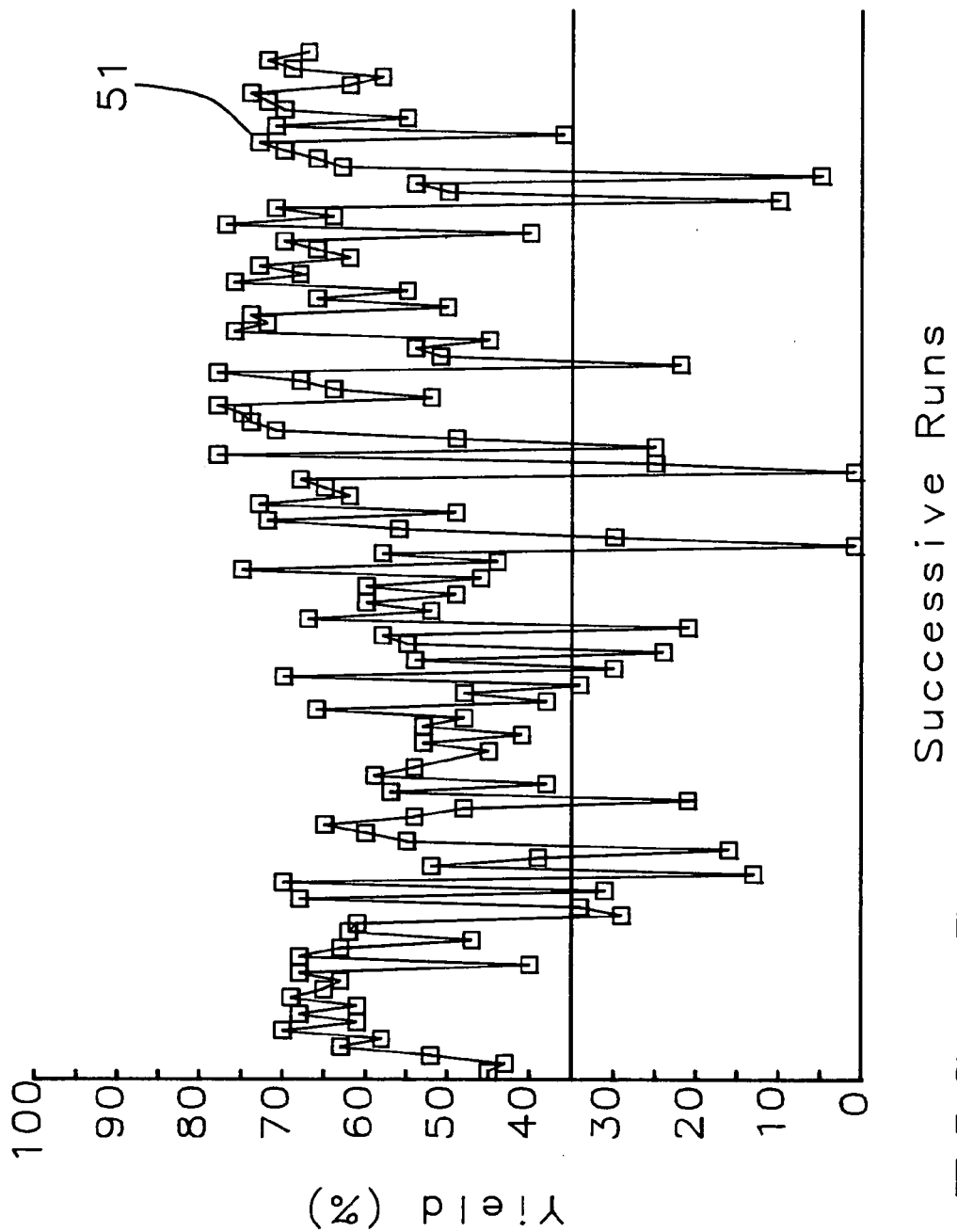
FIG. 5 shows similar data to FIG. 4, for % yield.

FIG. 5 shows similar data to that of FIG. 4, the point at which the new-style equipment began to be used being pointed to by arrow 51. The measure of success of a given run was, in this case, product yield, the minimum acceptable yield having been set at 35%. As can be seen, in a small, but significant, number of cases the yield (using the old-style sputtering shields) was less than 35% whereas, once the new-style sputtering shields were in place, the yield never fell below 35%. Additionally, the average yield was noticeably higher.

This improvement in the overall product yield is further illustrated in TABLE I which is for two different products:

TABLE I

| | % YIELD | |
|---|---|---|
| | Conventional shield | Arc-sprayed shield |
| Product #1 | 43 | 53 |
| Product #2 | 57 | 67 |

Another benefit of the use of an arc-sprayed inner coating for the sputtering shields, in accordance with the teachings of the present invention, was that the useful life of said shields was prolonged from 200 wafers processed to 700. Additionally, while it had been previously observed that, if a sputtering shield was allowed to sit idle for an extended period of time (of the order of several hours, typically about 6 hours) it tended to deposit a higher than normal amount of contaminant particles for the first two or three runs after its use had been resumed, this was not the case for the sputtering shields whose interior surfaces had been coated with arc-sprayed aluminum. With coated shields, the permissible idle time was found to have been extended to more than two days.

What is claimed is:

1. A method for reducing the amount of particle contamination in a sputter-etcher comprising:
   providing a sputter-etcher that includes a substrate holder and a sputtering shield; and
   coating the interior wall of said sputtering shield with a layer of arc-sprayed material having a surface directed toward said substrate holder, said surface of said layer having a roughness value of between about 120 and about 200 microns.

2. The method of claim 1 wherein said layer of arc-sprayed (metal) material comprises aluminum.

3. The method of claim 1 wherein the thickness of said layer of arc-sprayed material is between about 120 and about 180 microns.

4. A method for sputter-etching comprising:
   providing a substrate that is to be sputter-etched;
   providing a sputter-etcher that includes a substrate holder and a sputtering shield;
   coating the interior wall of said sputtering shield with a layer of arc-sprayed material having a surface directed toward said substrate holder, said surface of said layer having a roughness value between about 120 and about 200 microns;
   immersing said sputter-etcher in a gas at a pressure;
   placing said substrate on said substrate holder and positioning it inside said sputtering shield; and
   applying an RF voltage between the sputtering shield and the substrate holder.

5. The method of claim 4 wherein said layer of arc-sprayed material comprises aluminum.

6. The method of claim 4 wherein the thickness of said layer of arc-sprayed material is between about 120 and about 180 microns.

7. The method of claim 4 wherein said gas comprises argon at a pressure between about $4.5 \times 10^{-3}$ and about $7 \times 10^{-3}$ torr.

8. The method of claim 4 wherein said applied RF voltage is between about 1,550 and about 1,750 volts.

* * * * *

UNITED STATES PATENT AND TRADEMARK OFFICE
CERTIFICATE OF CORRECTION

PATENT NO.        : 6,942,764 B1                                                    Page 1 of 1
APPLICATION NO. : 08/518705
DATED             : September 13, 2005
INVENTOR(S)       : Cheng-Kun Lin, Chin-Shien Yang and Chuan-Huai Chen It is certified that error appears in the above-identified patent and that said Letters Patent is hereby corrected as shown below:

Column 4, lines 30-32, delete "a surface directed toward said substrate holder, said surface of said layer having a" and insert therefor --an A. A.--;

Column 4, claim 2, line 35, delete "(metal)";

Column 4, claim 4, lines 44-46, delete "a surface directed toward said substrate holder, said surface of said layer having a" and insert therefor --an A. A.--.

Signed and Sealed this

Thirteenth Day of March, 2007

JON W. DUDAS
*Director of the United States Patent and Trademark Office*